United States Patent
Yamauchi et al.

(10) Patent No.: US 10,637,466 B2
(45) Date of Patent: Apr. 28, 2020

(54) DRIVING DEVICE OF SEMICONDUCTOR SWITCH

(71) Applicant: DENSO CORPORATION, Kariya, Aichi-pref. (JP)

(72) Inventors: Kazuki Yamauchi, Kariya (JP); Yasutaka Senda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/534,416

(22) Filed: Aug. 7, 2019

(65) Prior Publication Data
US 2019/0363708 A1 Nov. 28, 2019

Related U.S. Application Data

(63) Continuation of application No. PCT/JP2017/045322, filed on Dec. 18, 2017.

(30) Foreign Application Priority Data

Mar. 8, 2017 (JP) .................................. 2017-043801

(51) Int. Cl.
*H03K 17/30* (2006.01)
*H03K 17/567* (2006.01)

(52) U.S. Cl.
CPC ........... *H03K 17/30* (2013.01); *H03K 17/567* (2013.01)

(58) Field of Classification Search
None
See application file for complete search history.

(56) References Cited

U.S. PATENT DOCUMENTS

| 5,977,814 A | 11/1999 | Ishii |
| 2012/0293218 A1 | 11/2012 | Dewa et al. |
| 2013/0307593 A1 | 11/2013 | Fukuta et al. |
| 2016/0036316 A1* | 2/2016 | Momota ................ H02M 1/08 363/78 |
| 2018/0034388 A1* | 2/2018 | Kawai .................. H03K 5/1536 |
| 2018/0145503 A1* | 5/2018 | Minagawa ......... G01R 19/0053 |
| 2019/0363708 A1* | 11/2019 | Yamauchi .............. H02M 7/48 |

FOREIGN PATENT DOCUMENTS

| JP | 2013-247734 A | 12/2013 |
| WO | 2017/026367 A1 | 2/2017 |

* cited by examiner

*Primary Examiner* — Lincoln D Donovan
*Assistant Examiner* — Khareem E Almo
(74) *Attorney, Agent, or Firm* — Posz Law Group, PLC

(57) ABSTRACT

In a driving device for driving a plurality of semiconductor switches connected in parallel to each other, a charge side conduction element is disposed in a charge side loop path including a conduction control terminal and a low-potential side conduction terminal of one of the semiconductor switches, and enables a charging current to flow in a conductive state. A discharge side conduction element is disposed in a discharge side loop path including the conduction control terminal and the low-potential side conduction terminal, and enables a discharging current to flow in a conductive state. A voltage detection unit is connected to a current output terminal of at least one of the charge side conduction element and the discharge side conduction element. A resistive element is connected in parallel to at least one of the charge side conduction element and the discharge side conduction element.

12 Claims, 16 Drawing Sheets

DRIVING DEVICE OF SEMICONDUCTOR SWITCH

CROSS REFERENCE TO RELATED APPLICATIONS

The present application is a continuation application of International Patent Application No. PCT/JP2017/045322 filed on Dec. 18, 2017, which designated the U.S. and claims the benefit of priority from Japanese Patent Application No. 2017-43801 filed on Mar. 8, 2017. The entire disclosures of all of the above applications are incorporated herein by reference.

TECHNICAL FIELD

The present disclosure relates to a driving device of a semiconductor switch.

BACKGROUND

As a driving device for driving a voltage-controlled semiconductor switch, a drive circuit for driving a semiconductor switch configuring each of an upper arm portion and a lower arm portion connected in series has been known. The semiconductor switch is, for example, an IGBT. Each of the upper arm portion and the lower arm portion is configured by one semiconductor switch.

SUMMARY

The present disclosure provides a driving device for driving a plurality of semiconductor switches connected in parallel to each other, and the driving device includes a charge side conduction element, a discharge side conduction element, a voltage detection unit, and a resistive element. The charge side conduction element is disposed in a charge side loop path including a conduction control terminal and a low-potential side conduction terminal of one of the semiconductor switches, and enables a charging current to flow in a conductive state. The discharge side conduction element is disposed in a discharge side loop path including the conduction control terminal and the low-potential side conduction terminal of the one of the semiconductor switches, and enables a discharging current to flow in a conductive state. The voltage detection unit is connected to a current output terminal of at least one of the charge side conduction element and the discharge side conduction element. The resistive element is connected in parallel to at least one of the charge side conduction element and the discharge side conduction element.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
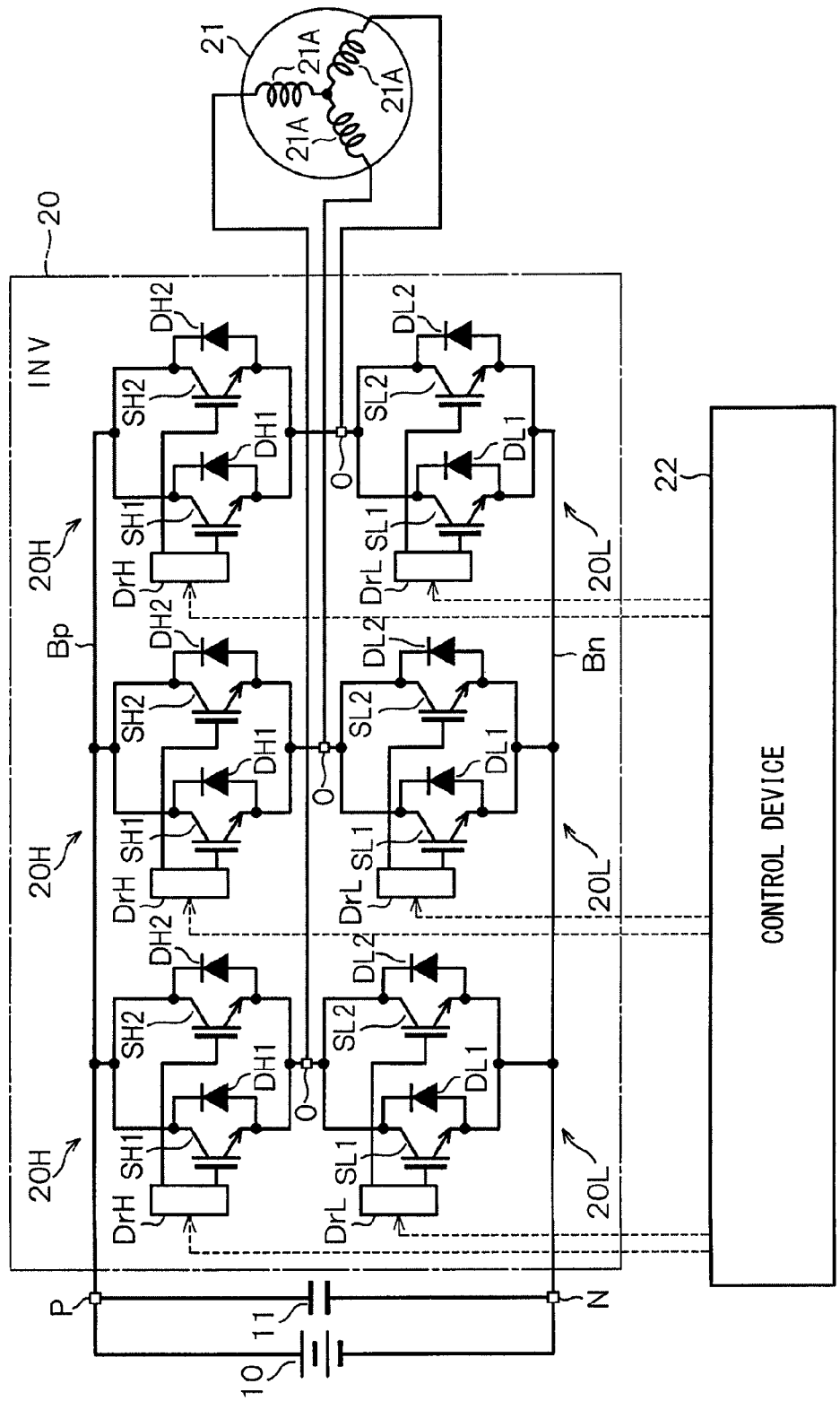
FIG. 1 is a diagram showing an overall configuration of a motor control system according to a first embodiment.

Some drive circuits drive multiple semiconductor switches connected in parallel to each other. A parallel connection body of the multiple semiconductor switches configures each of an upper arm portion and a lower arm portion. When each of the semiconductor switches is, for example, an IGBT, a capacitor is formed between a gate and an emitter of the IGBT. Thus, a loop path through which a current flows is provided between the IGBT and the drive circuit connected to the IGBT.

On the other hand, a recovery current flows through a free wheel diode connected in anti-parallel to the IGBT. When the recovery current circulates, a surge voltage is generated in a circulation path of the recovery current. In this instance, an emitter potential of the IGBT corresponding to the free wheel diode which is a source of the surge voltage is relatively lower than a potential of an emitter of the other IGBT. Such a potential difference occurs because the multiple IGBT emitters are connected to each other.

When the potential difference as described above occurs, an LC resonance occurs in each of the multiple IGBTs due to an inductance component and a gate-emitter capacitance in the loop path. When the LC resonance occurs, the voltages applied to the respective terminals such as the gate and the emitter exceed their rated values, which may cause inconveniences such as malfunction of the IGBT.

Among the free wheel diodes, at least two free wheel diodes may have different recovery current circulation completion timings due to individual differences or the like. When the circulation of the recovery current through the free wheel diodes is successively completed, the potential difference between the emitters of the IGBTs largely fluctuates. When the fluctuation of the potential difference becomes large, the inconvenience described above becomes remarkable.

In order to cope with the above issue, it is conceivable to reduce a switching speed of the IGBT when the IGBT is switched from an off-state to an on-state, but the switching losses may be increased. As another countermeasure, it is also conceivable to reduce the LC resonance by inserting a rectifying element such as a diode in the loop path described above.

In order to control the switching of the IGBT, it may be required to detect the gate voltage of the IGBT. In general, the drive circuit is often configured as an IC. It is desirable that the number of terminals for connecting the IGBT to the drive circuit is smaller in view of a demand for miniaturizing a package of the IC. For example, when a diode is inserted into a discharging path including the gate of the IGBT, a drop due to a forward voltage occurs at the cathode of the diode, resulting in a problem that a detection accuracy of the gate voltage is lowered.

A driving device according to an aspect of the present disclosure is configured to drive multiple semiconductor switches connected in parallel to each other and includes a charging terminal, a discharging terminal, a charging path, a discharging path, a charge side conduction element, a discharge side conduction element, a voltage detection unit, and a resistive element. The charging terminal and the discharging terminal are connected to a conduction control terminal of one of the semiconductor switches. The charging path includes a charge switch and the charging terminal. The charge switch enables a charging current to flow to the conduction control terminal of the one of the semiconductor switches when the one of the semiconductor switches is switched to an on-state. The discharging path includes a discharge switch and the discharging terminal. The discharge switch enables a discharging current to flow between the conduction control terminal and a low-potential side conduction terminal of the one of the semiconductor switches when the one of the semiconductor switches is switched to an off-state.

The charge side conduction element is disposed in a charge side loop path including the conduction control terminal and the low-potential side conduction terminal and constituting a part of the charging path, and enables the charging current to flow in a conductive state. The discharge side conduction element is disposed in a discharge side loop path including the conduction control terminal and the low-potential side conduction terminal and constituting a part of the discharging path, and enables the discharging current to flow in a conductive state. The voltage detection unit is connected to a current output terminal of at least one of the charge side conduction element and the discharge side conduction element. The resistive element is connected in parallel to at least one of the charge side conduction element and the discharge side conduction element. At least the charge switch, the discharge switch, and the voltage detection unit are configured as a drive IC. Note that, in the present disclosure, at least one of the charge side conduction element and the discharge side conduction element means the charge side conduction element, the discharge side conduction element, or both the charge side conduction element and the discharge side conduction element.

With the configuration described above, even if the charge side conduction element or the discharge side conduction element generates a voltage drop in a current carrying state, a current can be bypassed by the resistive element connected in parallel to at least one of the charge side conduction element and the discharge side conduction element. Therefore, even if the voltage detection unit is connected to the current output terminal of at least one of the charge side conduction element and the discharge side conduction element in order to reduce the number of connection terminal between the driving device and the one of the semiconductor switches, an influence of the voltage drop can be reduced.

For example, according to another aspect of the present disclosure, the discharge side conduction element and the charge side conduction element are formed of diodes. Therefore, in a period in which the terminal voltage of the diode becomes equal to or lower than the forward voltage, the current is carried through the resistive element, so that the voltage of the conduction control terminal of the semiconductor switch can be detected more accurately.

First Embodiment

Hereinafter, a first embodiment in which a drive circuit according to the present invention is applied to an in-vehicle motor control system will be described with reference to the drawings. As shown in FIG. 1, the control system includes a DC power supply 10, an inverter 20, a motor generator 21, and a control device 22. In the present embodiment, the DC power supply 10 is a storage battery having an inter-terminal voltage of 100 V or more. As the DC power supply 10, for example, a lithium ion storage battery or a nickel metal hydride storage battery is used. A capacitor 11 is connected in parallel with the DC power supply 10.

The motor generator 21 is a rotary electric machine that is an on-board main machine, and is configured so that a power is transmitted between the motor generator 21 and driving wheels (not shown). For example, a three-phase permanent magnet synchronous motor is used as the motor generator 21. The vehicle of the present embodiment is equipped with an engine (not shown) in addition to the motor generator 21.

The inverter 20 is a power converter that converts a DC power input from the capacitor 11 into an AC power and outputs the AC power to the motor generator 21. The inverter 20 includes series connection bodies each having an upper arm portion 20H and a lower arm portion 20L for three phases. The upper arm portion 20H includes a parallel connection body having a first upper arm switch SH1 and a second upper arm switch SH2. The lower arm portion 20L includes a parallel connection body having a first lower arm switch SL1 and a second lower arm switch SL1. According to the present embodiment, an IGBT, which is one of voltage-controlled semiconductor switching elements, is used as the switches SH1, SH1, SL1, and SL1.

Collectors of the upper arm switches SH1 and SH2 are connected to a high-potential side terminal, that is, a P terminal of the capacitor 11 through a high-potential side conductive member Bp such as a busbar. Emitters of the lower arm switches SL1 and SL2 are connected to a low-potential side terminal, that is, an N terminal of the capacitor 11 through a low-potential side conductive member Bn such as a busbar. Emitters of the upper arm switches SH1 and SH2 and collectors of the lower arm switches SL1 and SL2 are connected to an O terminal. The emitter corresponds to a low-potential side conduction terminal of the semiconductor switching element, and the collector corresponds to a high-potential side conduction terminal of the semiconductor switching element. The gate corresponds to a conduction control terminal.

One end of a winding 21A of the motor generator 21 is connected to the O terminal of each of the three phases through a conductive member such as a busbar. The other end of the winding 21A of each phase is connected to a neutral point. The winding 21A is an inductive load.

First and second upper arm diodes DH1 and DH2 are connected in anti-parallel to the arm switches SH1, SH2, respectively. First and second lower arm diodes DL1 and DL2 are connected in anti-parallel to the arm switches SL1, SL2, respectively. According to the present embodiment, the diodes DH1, DH2, DL1, and DL2 correspond to "free wheel diodes". Those diodes may be integrally formed with the respective switches SH1, SH1, SL1, and SL1, or may be externally attached to the respective switches SH1, SH1, SL1, and SL1.

The control device 22 controls the drive of the inverter 20 so that a torque, for example, which is a controlled variable of the motor generator 21, matches a command value. The control device 22 outputs drive signals corresponding to the respective arm portions 20H and 20L to drive circuits DrH and DrL provided individually for the respective arm portions 20H and 20L in order to turn on and off the switches SH1, SH2, SL1, and SL2 of the inverter 20.

The control device 22 generates drive signals corresponding to the respective drive circuits DrH and DrL by, for example, a PWM control based on a magnitude comparison between a three-phase command voltage whose phase is shifted by 120 degrees by an electric angle and a carrier signal such as a triangle wave. In each phase, the drive signal corresponding to the upper arm portion 20H and the drive signal corresponding to the lower arm portion 20L are complementary signals to each other. Thus, in each phase, the respective switches SH1 and SH2 configuring the upper arm portion 20H and the respective switches SL1 and SL2 configuring the lower arm portion 20L are alternately turned on.

Figure 2:
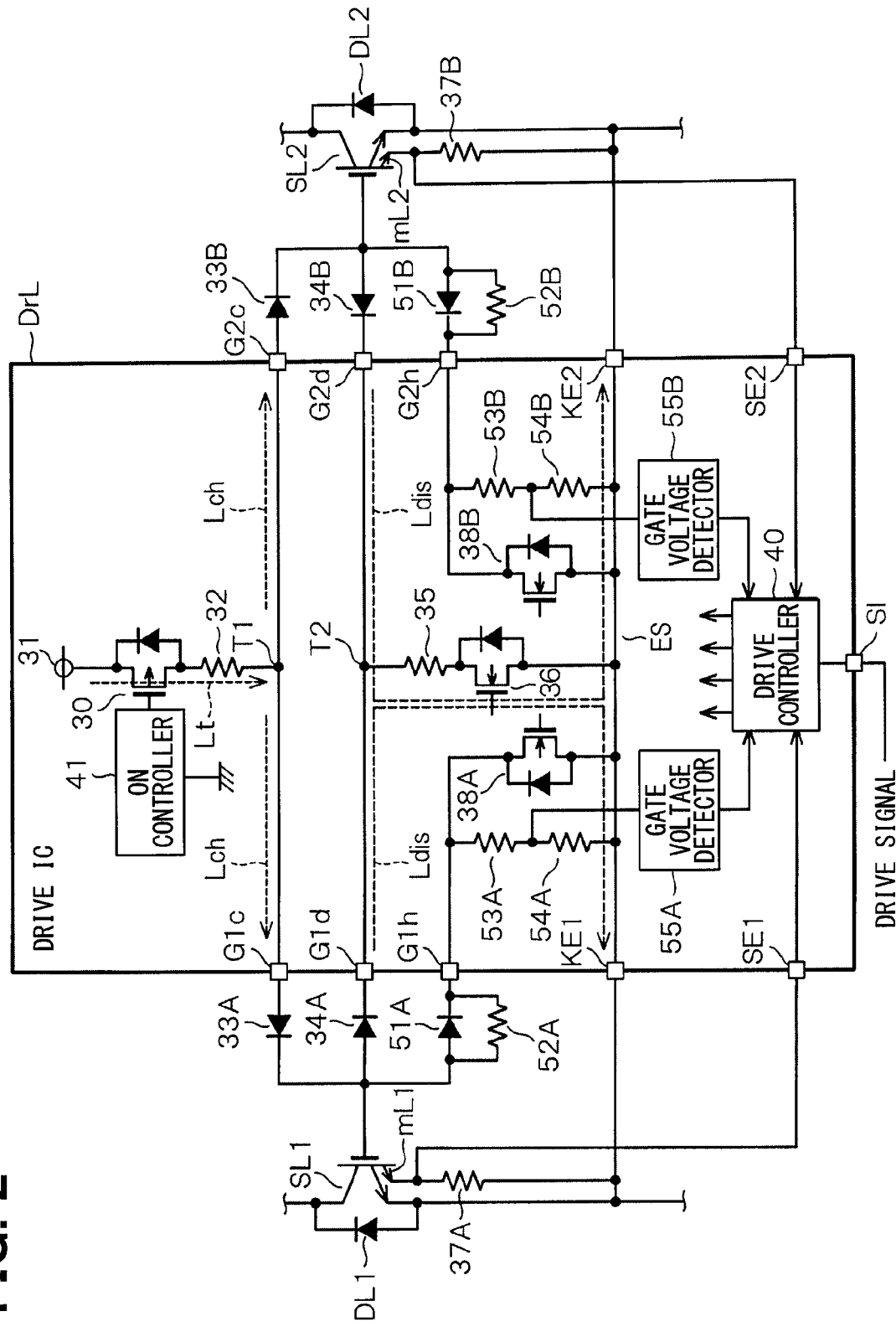
FIG. 2 is a diagram showing a drive circuit.

As shown in FIG. 2, the drive circuits DrH and DrL corresponding to the arm portions 20H and 20L basically have the same configuration. Hereinafter, the drive circuit DrL of the lower arm portion 20L will be described as an example. The drive circuit DrL includes a control board on which various electronic components are mounted. The various electronic components are connected by wiring patterns on the control board, and the drive circuit DrL is configured as an IC.

The drive circuit DrL includes a charge switch 30 which is, for example, a P-channel MOSFET. A constant voltage power supply 31 is connected to a source of the charge switch 30, and one end of a charging resistive element 32 is connected to a drain of the charge switch 30. A first connection point T1 is connected to the other end of the charging resistive element 32. According to the present embodiment, an electric path passing through the constant voltage power supply 31, the charge switch 30, the charging resistive element 32, and the first connection point T1 in a stated order corresponds to "a power supply path Lt".

A first gate terminal G1c of the drive circuit DrL is connected to the first connection point T1 and an anode of a first charge side diode 33A, which is a charge side conduction element. The gate of the lower arm switch SL1 are connected to a cathode of the diode 33A. The gate of the lower arm switch SL1 is connected to an anode of a first discharge side diode 34A which is a discharge side conduction element. A cathode of the first discharge side diode 34A and a second connection point T2 are connected to a second gate terminal G1d of the drive circuit DrL.

One end of the discharge resistive element 35 is connected to the second connection point T2, and the other end of the resistive element 35 is connected to a drain of a discharge switch 36, which is an N-channel MOSFET, for example. A source of the discharge switch 36 is connected to a short-circuit path ES which is an electric path that short-circuits a first emitter terminal KE1 and a second emitter terminal KE2 of the drive circuit DrL. Emitters of the arm switches SL1 and SL2 are connected to the emitter terminals KE1 and KE2, respectively.

The first lower arm switch SL1 includes a first lower arm sense terminal mL1, and the terminal mL1 outputs a small current correlated with a collector current flowing through the first lower arm switch SL1. A first sense terminal SE1 of the drive circuit DrL is connected to the first lower arm sense terminal mL1. One end of a first sense resistive element 37A is connected to the first sense terminal SE1. The other end of the first sense resistive element 37A is connected to the first emitter terminal KE1.

According to the above configuration, a voltage drop occurs in the first sense resistive element 37A due to a minute current output from the sense terminal mL1, and a voltage drop amount becomes a correlation value of the collector current. A potential difference of the first sense resistive element 37A is input to a drive controller 40 of the drive circuit DrL as a first sense voltage.

The drive circuit DrL includes a first off-holding switch 38A which is, for example, an N-channel MOSFET. A drain of the first off-holding switch 38A is connected to a third gate terminal G1h of the drive circuit DrL. A source of the first off-holding switch 38A is connected to the short-circuit path ES. The path leading to the gate terminal G1h, the off-holding switch 38A, and the short-circuit path ES corresponds to an off-holding path. A diode 51A, which is a discharging conduction element and an off-side conduction element, is connected in a forward direction between the gate of the lower arm switch SL1 and the third gate terminal G1h. A resistive element 52A is connected in parallel to the diode 51A. A cathode of the diode 51 corresponds to a current output terminal.

A series circuit of resistive elements 53A and 54A is connected between the third gate terminal G1h and the first emitter terminal KE1. The series circuit corresponds to a voltage dividing circuit and configures a voltage detection unit. A common connection point of the resistive elements 53A and 54A is connected to an input terminal of a gate voltage detector 55A. An output terminal of the gate voltage detector 55A is connected to an input terminal of the drive controller 40.

Although the configuration corresponding to the lower arm switch SL1 of the drive circuit DrL has been described above, a configuration corresponding to the lower arm switch SL2 is symmetrical with the above configuration. In FIG. 2, the components corresponding to the lower arm switch SL2 are denoted by "B" instead of "A" or "2" instead of "1". When a component corresponding to the lower arm switch SL1 and a component corresponding the lower arm switch SL2 are collectively referred, an index such as "1", "2", "A" and "B" will be omitted.

In the present embodiment, an electric path passing through "the first connection point T1, the first gate terminal G1c, and the first charge side diode 33A" in a stated order and an electric path passing through "the first connection point T1, the second gate terminal G2c, and the second charge side diode 33B" in a stated order correspond to "a branch path Lch" branched from the power supply path Lt. The power supply path Lt and the branch path Lch correspond to a "charging path".

In the present embodiment, an electric path passing through "the first discharge side diode 34A, the second gate terminal G1d, the second connection point T2, the discharge resistive element 35, the discharge switch 36, and the first emitter terminal KE1 in a stated order" corresponds to "a discharging path Ldis".

The drive controller 40 alternately performs a charging process and a discharging process based on a drive signal output from the control device 22 and input through a signal terminal SI of the drive circuit DrL. More specifically, the drive controller 40 sets the charge switch 30 to an on-state and the discharge switch 36 to an off-state when the drive signal indicates an on-drive command as the charging process. As a result, a charging current flows from the constant voltage power supply 31 to the gates of the respective lower arm switches SL1 and SL2, and the gate voltages of the respective lower arm switches SL1 and SL2 becomes equal to or higher than a threshold voltage Vth. As a result, the respective lower arm switches SL1 and SL2 are turned on. The drive of the charge switch 30 is performed by controlling an ON controller 41 by the drive controller 40.

On the other hand, as the discharging process, when the drive signal indicates an off-drive command, the drive controller 40 turns off the charge switch 30 and turns on the discharge switch 36. As a result, a discharging current flows from the gates to the emitters of the respective lower arm switch SL1 and SL2, and the gate voltages of the respective lower arm switches SL1 and SL2 become less than the threshold voltage Vth. As a result, the lower arm switches SL1 and SL2 are turned off.

The drive controller 40 performs an off-holding process based on the drive signal and the gate voltage output from the control device 22. More specifically, the drive controller 40 turns on the off-holding switches 38A and 38B when the drive signal indicates an off-drive command and the gate voltage is equal to or lower than a prescribed voltage Vα, and turns off the off-holding switches 38A and 38B in other cases, as the off-holding process. In this example, the prescribed voltage Vα is set to a voltage equal to or lower than the threshold voltage Vth.

Figure 3:
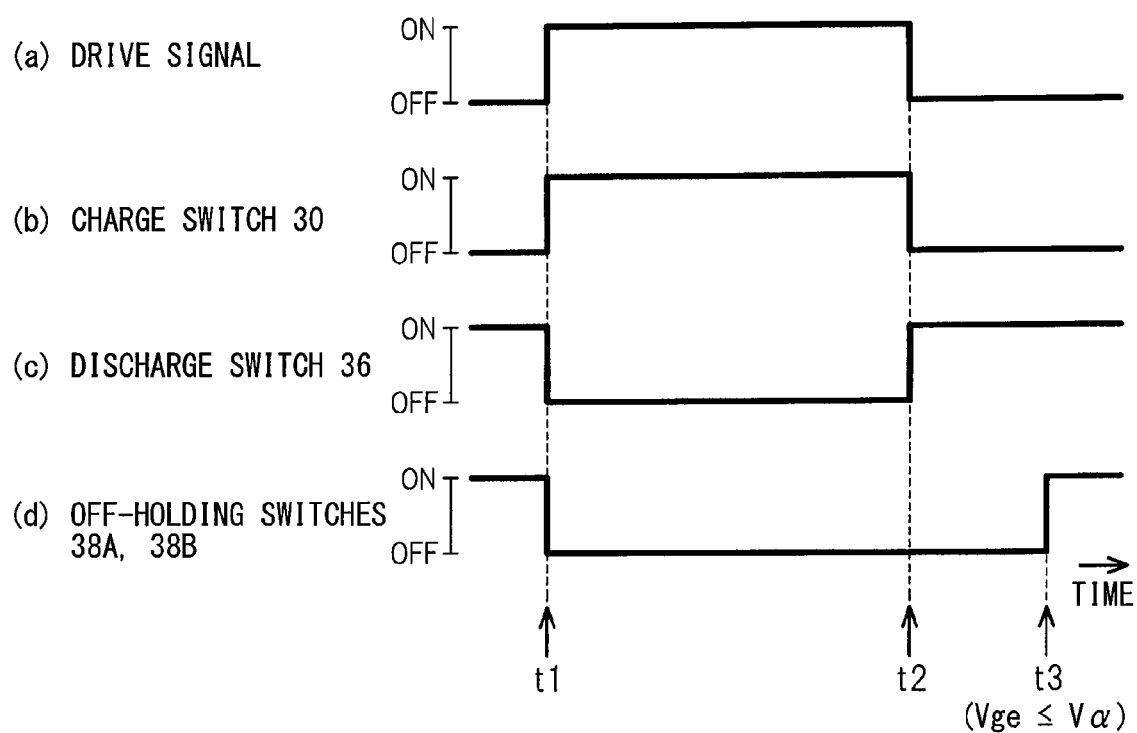
FIG. 3 is a timing diagram showing operation modes of switches in the drive circuit.

As shown in (a) to (c) in FIG. 3, when the drive signal is switched from the off-drive command to the on-drive command at a time t1, the charging process is started in which the charge switch 30 is turned on and the discharge switch 36 is turned off. As a result, thereafter, the gate voltages of the respective lower arm switches SL1 and SL2 rise to become equal to or higher than the threshold voltage Vth, and the respective lower arm switches SL1 and SL2 are switched to the on-state. In addition, as shown in (a) and (d) in FIG. 3, when the drive signal is switched from the off-drive command to the on-drive command, the off-holding switches 38A and 38B are switched from the on-state to the off-state.

Thereafter, at a time t2, the drive signal is switched from the on-drive command to the off-drive command. Thus, the charge switch 30 is turned off, and the discharging process in which the discharge switch 36 is turned on is started. As a result, the gate voltages of the respective lower arm switches SL1 and SL2 start to decrease.

Thereafter, at a time t3, since the gate voltage becomes equal to or lower than the prescribed voltage Vα, each of the off-holding switches 38A and 38B is switched to the on-state, and the off-holding process is started. The gate voltage used in the off-holding process may be set to, for example, higher one of the gate voltages of the lower arm switches SL1 and SL2.

In the present embodiment, as shown in FIG. 2, the drive circuit DrL includes the charge side diodes 33A, 33B and discharge side diodes 34A, 34B 51A, and 51B. Hereinafter, the technical significance of arranging each diode will be described in comparison with a related art shown in FIGS. 4 to 9. In the related art, the diodes 33A, 33B, 34A, 34B, 51A, and 51B are removed from the drive circuit DrL shown in FIG. 2. For convenience of description, the gate terminals corresponding to one arm switch are collectively referred to as G1 and G2.

Figure 4:
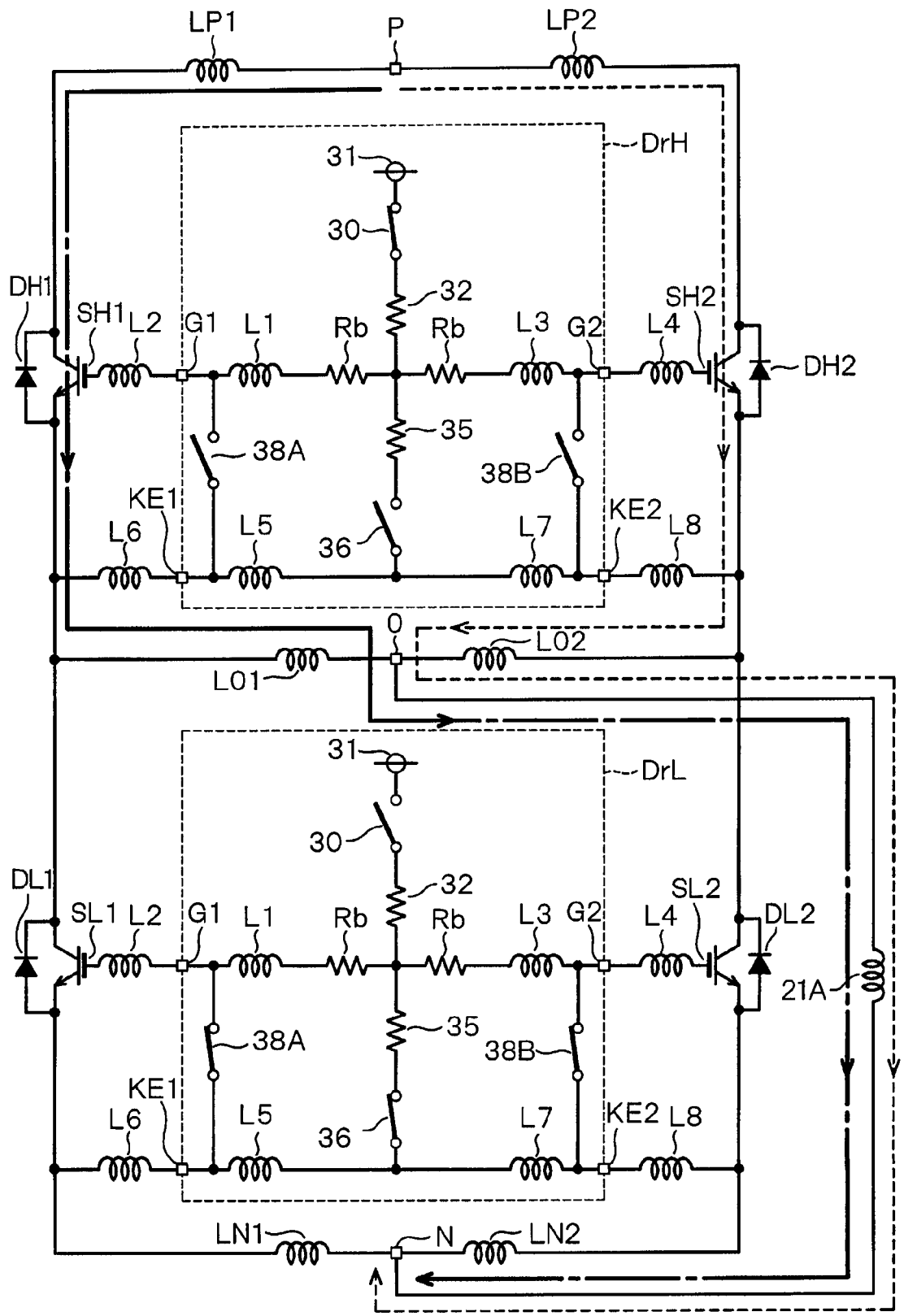
FIG. 4 is a diagram for explaining a generation mode of an LC resonance according to a related art.

In FIG. 4, inductance components present in the wiring portions and the like are indicated in the configuration of the related art. Specifically, the inductance components are present in the following respective electric paths.

LP1: the P terminal, the high-potential side conductive member Bp, and the collector of the switch SH1 in a stated order LP2: the P terminal, the high-potential side conductive member Bp, and the collector of the switch SH2 in a stated order LO1: the emitter of the switch SH1, the collector of the switch SL1, and the O terminal in a stated order LO2: the emitter of the switch SH2, the collector of the switch SL2, and the O terminal in a stated order LN1: the N terminal, the low-potential side conductive member Bn, and the emitter of the switch SL1 in a stated order LN2: the N terminal, the low-potential side conductive member Bn, and the emitter of the switch SL2 in a stated order In the drive circuits DrH and DrL, L1 to L8 are the following inductance components.

L1: the first gate terminal G1
L3: the second gate terminal G2
L5: the first emitter terminal KE1
L7: the second emitter terminal KE2
L2: a path connecting the gate of the switching SL1 and the first gate terminal G1
L4: a path connecting the gate of the switching SL2 and the second gate terminal G2
L6: a path connecting the emitter of the switch DH1 and the first emitter terminal KE1
L8: a path connecting the emitter of the switching DH2 and the second emitter terminal KE2

Note that Rb represents a balance resistance.

FIG. 4 shows an exemplary state in which the respective switches SH1 and SH2 configuring the upper arm portion 20H are turned on and the respective switches SL1 and SL2 configuring the lower arm portion 20L are turned off in any one of the three phases. In this condition, a current flows through a path passing through "the P terminal, the first upper arm switch SH1, the O terminal, the winding 21A for two phases, the lower arm portion 20L of the other phase (not shown), and the N terminal" in a stated order, which is indicated by a dash-dot line in the drawing. In addition, a current flows through a path passing through "the P terminal, the second upper arm switch SH2, the O terminal, the winding 21A for two phases, the lower arm portion 20L of the other phase (not shown), and the N terminal" in a stated order, which is indicated by a broken line in the drawing.

Figure 5:
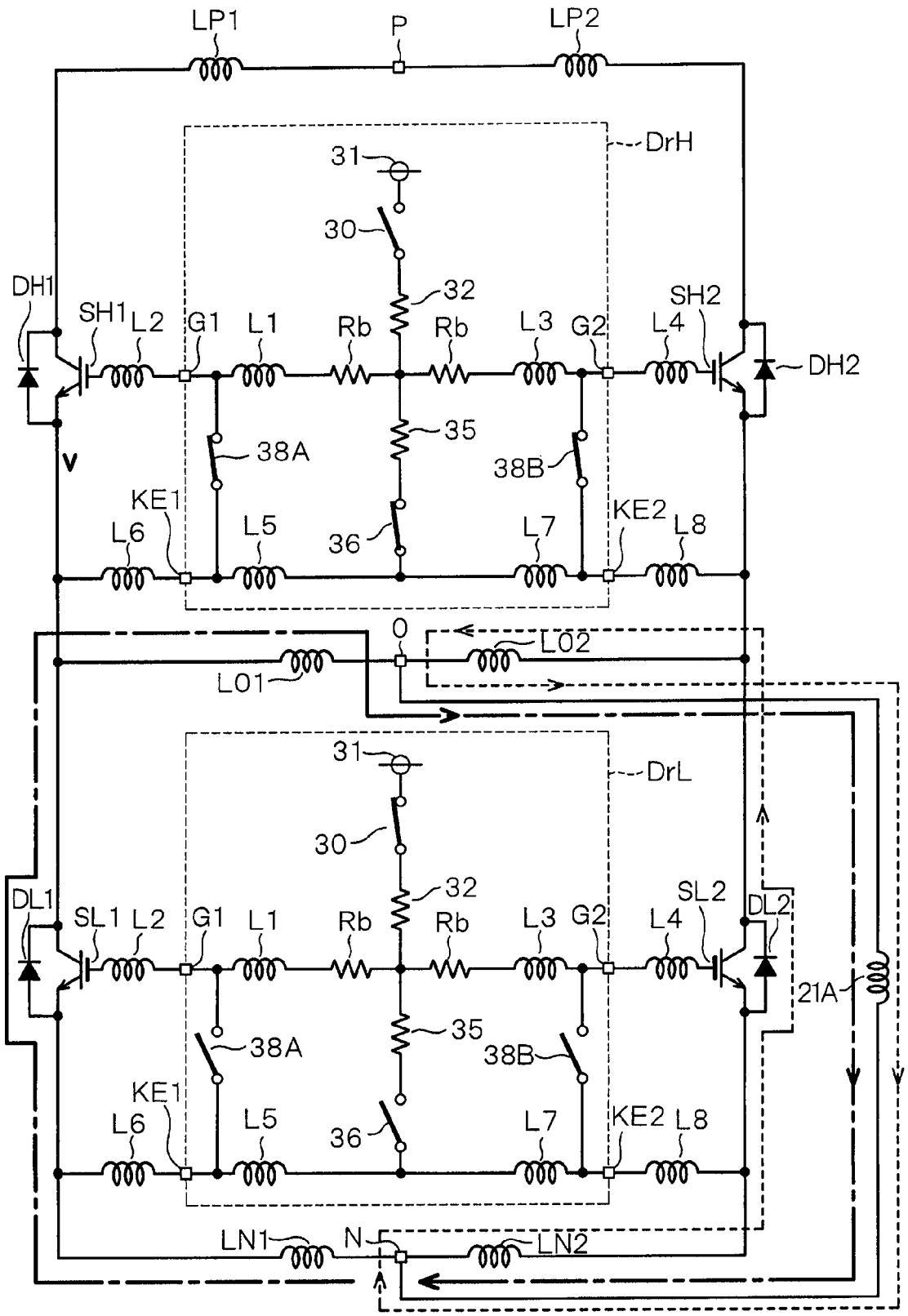
FIG. 5 is a diagram for explaining the generation mode of the LC resonance according to the related art.

FIG. 5 shows an example in which the respective switches SH1 and SH2 configuring the upper arm portion 20H are switched to the off-state, and the respective switches SL1 and SL2 configuring the lower arm portion 20L are switched to the on-state. In this condition, due to the presence of the winding 21A as an inductive load, a current continues to flow through a loop path passing through "the first lower arm diode DL1, the O terminal, the winding 21A, and the lower arm portion 20L of the other phase (not shown)" in a stated order, which is indicated by a dashed line in the drawing. In addition, a current continues to flow through a loop path passing through "the second lower arm diode DL2, the O terminal, the winding 21A, and the lower arm portion 20L of the other phase (not shown)" in a stated order, which is indicated by a broken line in the drawing.

Figure 6:
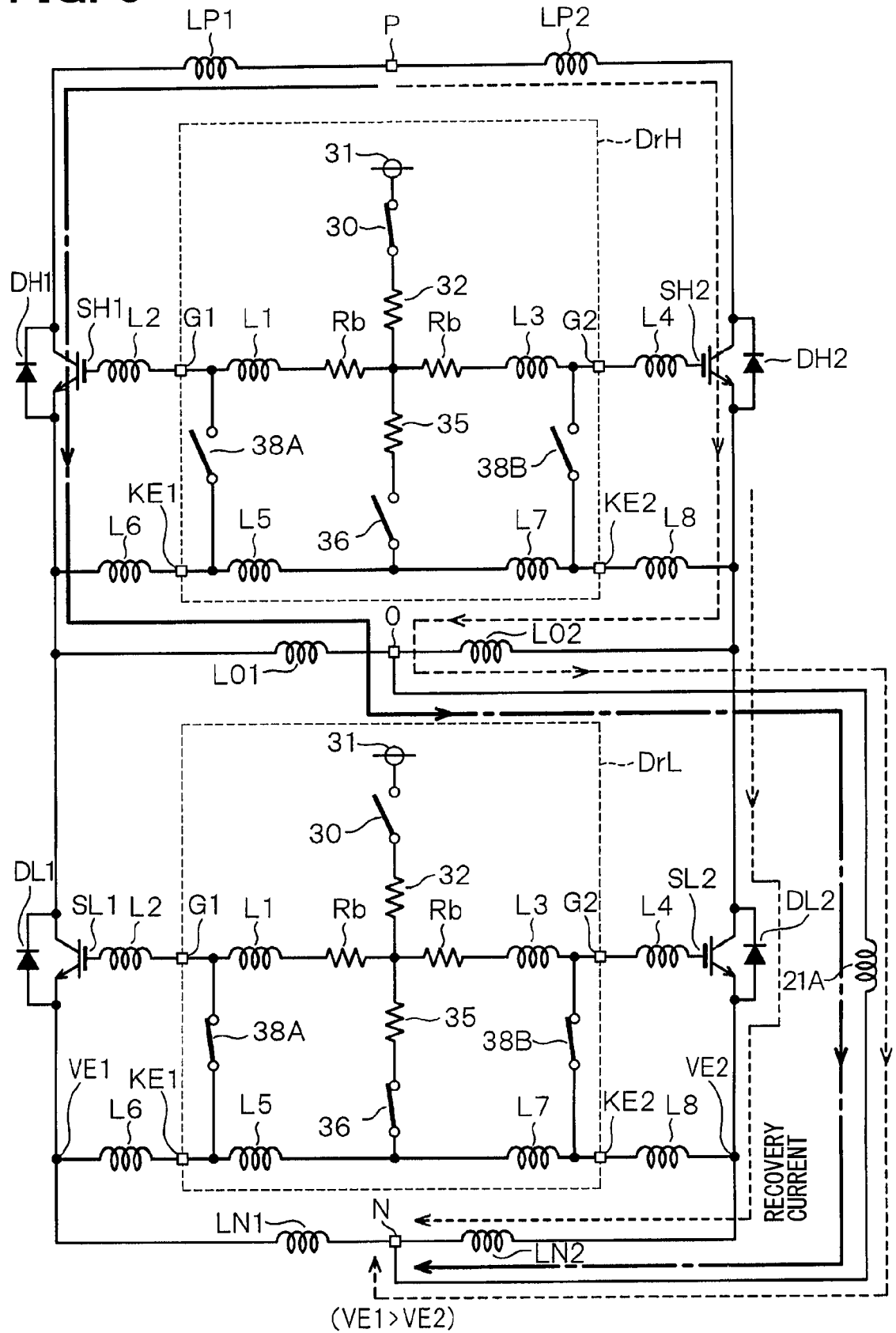
FIG. 6 is a diagram for explaining the generation mode of the LC resonance according to the related art.

FIG. 6 shows an example in which the respective upper arm switches SH1 and SH2 configuring the upper arm portion 20H are switched to the on-state again, and the respective lower arm switches SL1 and SL2 configuring the lower arm portion 20L are switched to the off-state again. In this instance, a recovery current flows through the second lower arm diode DL2 due to the application of a reverse voltage. Thereafter, when the circulation of the recovery current is completed, a surge voltage is generated in the low-potential side conductive member Bn. The surge voltage is proportional to a multiplication value of a reduction rate dI/dt of the recovery current and an inductance L of the low-potential side conductive member Bn or the like. When the surge voltage is generated, an emitter potential VE2 of the second lower arm switch SL2 becomes lower than an emitter potential VE1 of the first lower arm switch SL1.

Figure 7:
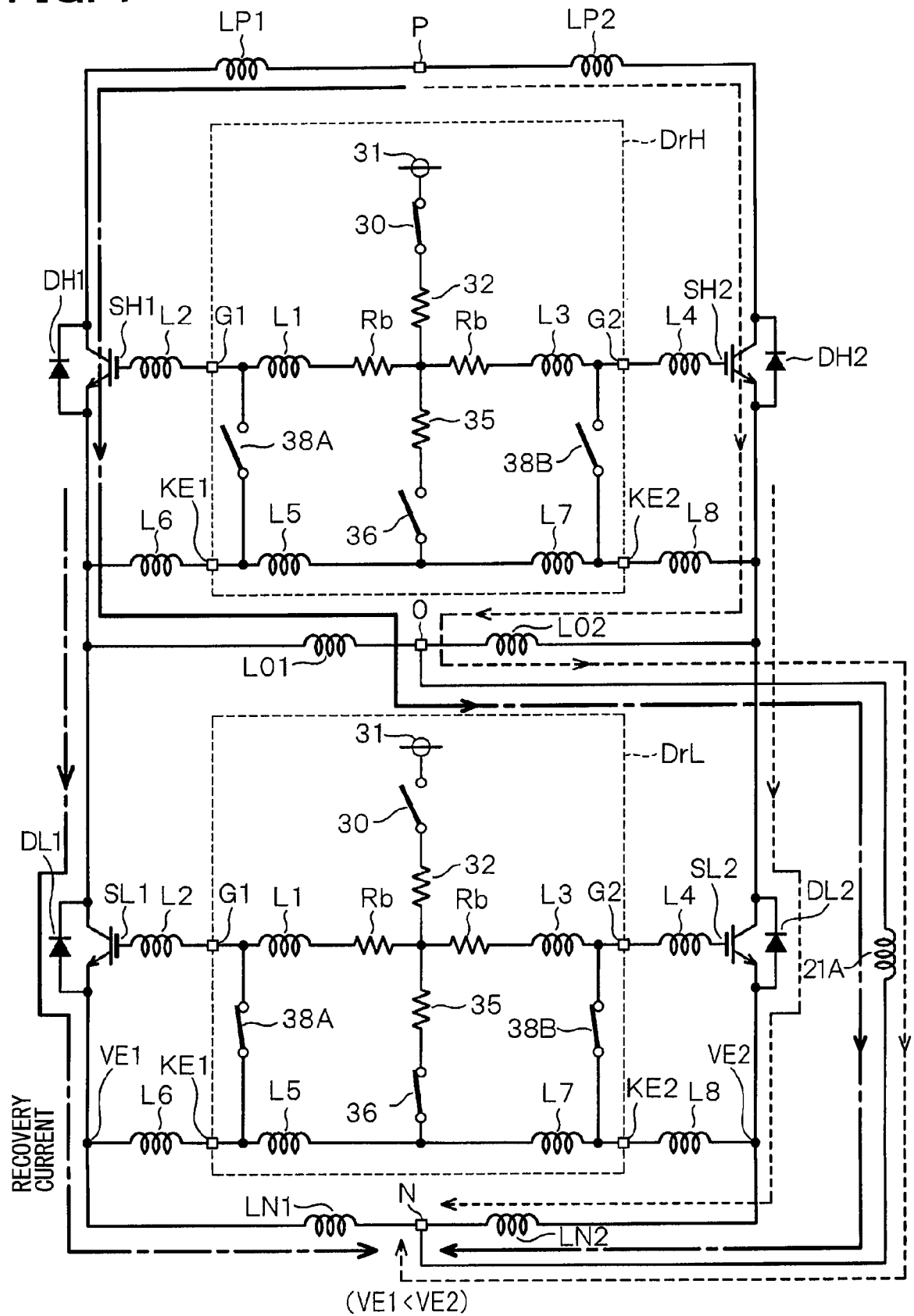
FIG. 7 is a diagram for explaining the generation mode of the LC resonance according to the related art.

Thereafter, as shown in FIG. 7, the recovery current flows through the first lower arm diode DL1 due to the application of the reverse voltage to the first lower arm diode DL1. When the circulation of the recovery current is completed, a surge voltage is generated in the low-potential side conductive member Bn. Due to the generation of the surge voltage, the emitter potential VE1 of the first lower arm switch SL1 becomes lower than the emitter potential VE2 of the second lower arm switch SL2.

Figure 8:
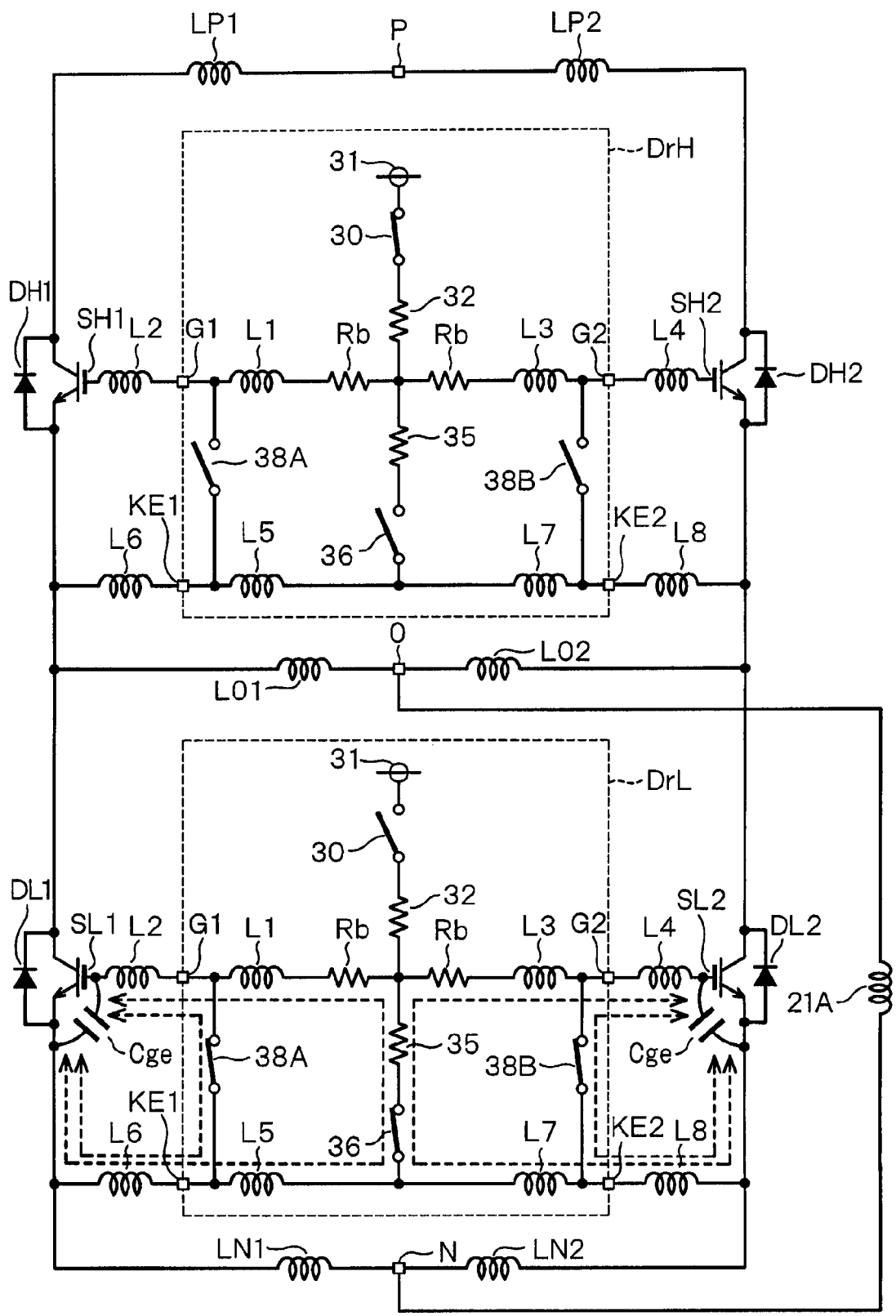
FIG. 8 is a diagram for explaining the generation mode of the LC resonance according to the related art.

As shown in FIG. 8, an LC resonance occurs in a loop path including the gates and emitter capacitances Cge of the respective lower arm switches SL1 and SL2 due to a difference in the emitter potentials of the lower arm switches SL1 and SL2. In FIG. 8, an example of the loop path is indicated by a broken line arrow.

When the LC resonance occurs, the applied voltages of the gate terminals G1, G2, the emitter terminals KE1, KE2, the sense terminals SE1, SE2, and the like may exceed their rated values, and the lower arm switches SL1 and SL2 may malfunction, and the detection accuracy of the sense voltages may deteriorate. To address the above issue, it is also conceivable to reduce the switching speed of each arm switch. However, in this case, there is a concern that a switching loss increases and a fuel efficiency of the vehicle deteriorates.

When the respective lower arm switches SL1 and SL2 are switched to the on-state and the respective upper arm switches SH1 and SH2 are switched to the off-state, the LC resonance occurs in the upper arm portion 20H similarly to the lower arm portion 20L.

Figure 9:
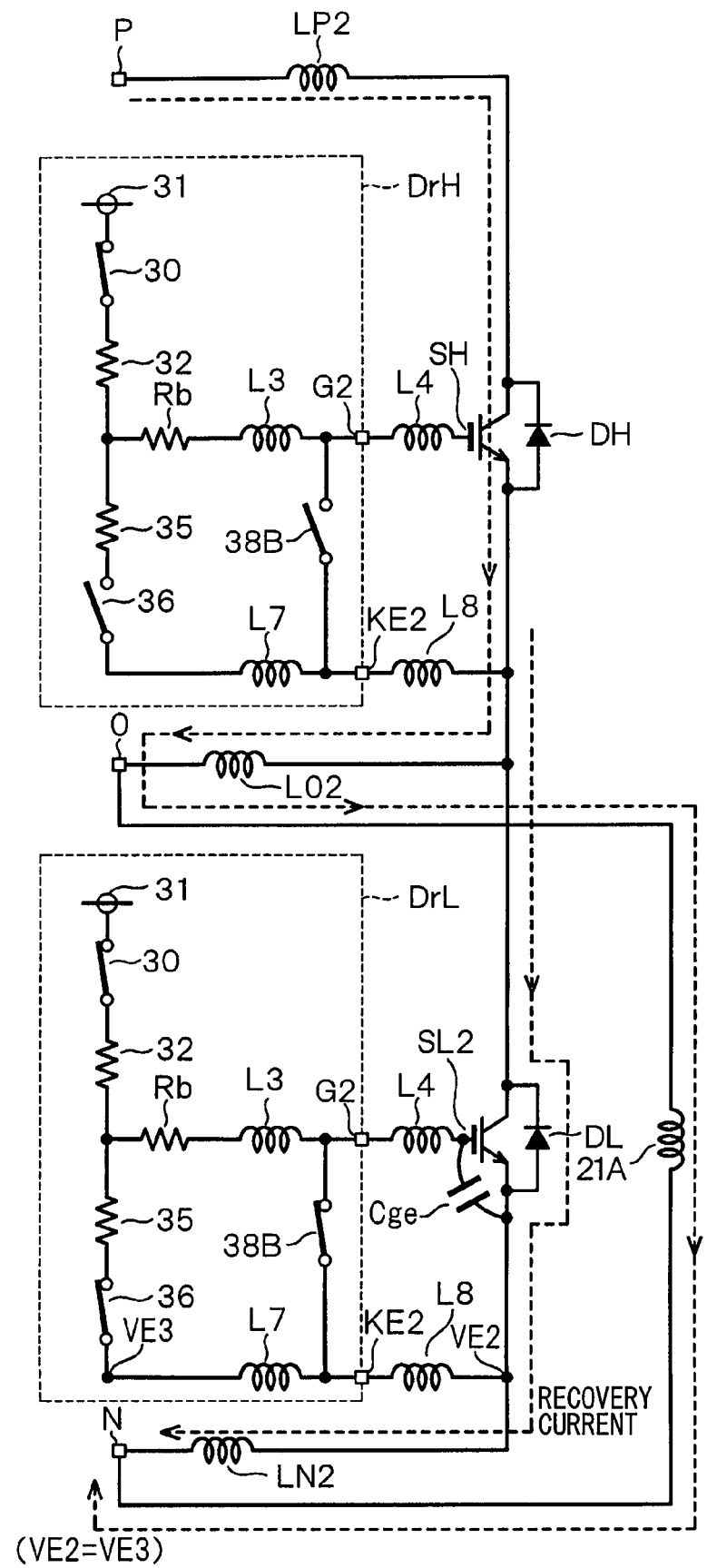
FIG. 9 is a diagram illustrating a generation mode of an LC resonance according to another related art.

FIG. 9 shows an example in which each of the arm portions 20 and 20L is configured by one arm switch with reference to the configuration shown in FIG. 4 described above. In that case, even if the surge voltage is generated due to the completion of the circulation of the recovery current, the LC resonance does not occur. This is because even if the surge voltage is generated, a difference between the emitter potential VE2 of the second lower arm switch SL2 and the source side potential VE3 of the discharge switch 36 is not generated.

In the present embodiment, in order to reduce the LC resonance phenomenon described above, each of the diodes 33, 34, and 51 is provided as shown in FIG. 2. As a result, LC resonance in the charge side loop path and the discharge side loop path is reduced. Since the operation of the parallel resistive element 52 will be described later, the resistive element 52 is ignored with respect to the diode 51. In this example, first to third charge side loop paths C1, C2, and C3 are respectively as follows.

The first charge side loop path C1: a path including a first capacitor Cge1 on the switch SL1 side, the gate of the switch SL1, the first gate terminal G1, the first connection point T1, the second gate terminal G2, the gate and the emitter of the switch SL2, a second capacitor Cge2 on the switch SL2 side, the second emitter terminal KE2, the first emitter terminal KE1, and the emitter of the switch SL1.

The second charge side loop path C2: a path including the first capacitor Cge1, the gate of the switch SL1, the first gate terminal G1, the first connection point T1, a target element (one of the discharge resistive element 35, and the switches 38A, 38B), the first emitter terminal KE1, and the emitter of the first lower arm switch SL1.

The third charge side loop path C3: a path including the second capacitor Cge2, the gate of the switch SL2, the second gate terminal G2, the first connection point T1, the target element, the second emitter terminal KE2, and the emitter of the switch SL2.

The charge side diode 33A or 33B is disposed in the first to third charge side loop paths, thereby being capable of limiting a flow direction of the current flowing in the respective charge side loop paths to only one direction. As a result, the LC resonance in each charge side loop path can be reduced.

On the other hand, the first to third discharge side loop paths D1, D2, and D3 are respectively as follows.

The first discharge side loop path D1: the charge side loop path C2 excluding the connection point T1

The second discharge side loop path D2: the connection point T1 of the charge side loop path C1 is replaced with the connection point T2

The third discharge side loop path D3: the charge side loop path C3 excluding the connection point T1

The discharge side diodes 34 and 51 are disposed in the first to third discharge side loop paths D1 to D3, thereby being capable of limiting a flow direction of the current flowing in those loop paths to only one direction. As a result, the LC resonance in the loop paths D1 to D3 can be reduced.

As described above, according to the present embodiment, the LC resonance can be reduced even when the recovery current circulation completion timings of the respective arm diodes configuring the respective arm portions are different from each other.

Further, according to the present embodiment, the resistive element 52 is connected in parallel with the diode 51 in accordance with the provision of the gate voltage detector 55. Next, the significance of the above configuration will be described. The drive controller 40 monitors the gate voltage when the switch SL is turned off, and turns on the off-holding switch 38 when the gate voltage drops to some extent, thereby holding the off-state of the switch SL. This makes it necessary to improve the detection accuracy in a region where the gate voltage is low.

However, as described above, the diode 51 for preventing the LC resonance is disposed in the path where the gate of the switch SL is connected to the off-holding switch 38. As a result, a voltage drop corresponding to a forward voltage Vf initially occurs in the gate voltage detected by the gate voltage detector 55 through a series circuit of the resistive elements 53 and 54. When the gate voltage becomes less than the forward voltage Vf, the diode 51 is turned off, and therefore the gate voltage detector 55 cannot detect the gate voltage.

Therefore, the resistive element 52 is connected in parallel with the diode 51, and a current in a period in which the diode 51 is turned off is supplied to the resistive element 52, thereby being capable of detecting the gate voltage by the gate voltage detector 55 in the above period.

Assuming that the resistance values of the resistive elements 52 to 54 are R52 to R54, respectively, the resistance value R52 is set to "R52<<R53+R54" with the value capable of reducing the LC resonance as a minimum value. As a result, when the gate voltage of the switch SL is Vg1 and the gate voltage detected by the gate voltage detector 55 is Vg2, "Vg2=Vg1×R54/(R52+R53+R54)≈Vg1×R54/(R53+R54)" is established.

As described above, according to the present embodiment, the gate terminals Gc, Gd, and Gh are connected to the gates of the switches SL in the drive circuit DrL for driving the two lower arm switches SL1, SL2 in parallel. Further, the gate is provided with the charging paths Lt and Lch including the charge switch 30 and the charging terminal Gc through which the charging current flows when the switch SL is turned on, and a discharging path Ldis including the discharge switch 36 and the discharging terminal Gd through which the discharging current flows between the gate and the emitter of the switch SL when the switch SL is turned off.

The diode 33 is disposed in the charge side loop paths C1 to C3 including the gate and the emitter and forming a part of the charging path, and enables the charging current to flow when the diode 33 is turned on. The diodes 34 and 51 are disposed in the discharge side loop paths D1 to D3 including the gate and the emitter and defining a part of the discharging path, and enables the discharging current to flow when the diodes 34 and 51 are turned on. The gate voltage detector 55 is connected to the cathode side of the diode 51, and the resistive element 52 is connected in parallel to the diode 51.

With the configuration described above, even if the gate voltage of the switch SL is lowered to be less than the forward voltage Vf of the diode 51 at the time of discharge, the current can be bypassed by the resistive element 52. Therefore, in order to reduce the number of connection terminals between the drive circuit DrL and the switch SL, even if the gate voltage detector 55 is connected to the cathode of the diode 51, the gate voltage can be accurately detected even in a region where the gate voltage is lowered to the vicinity of 0 V.

A voltage dividing circuit including the resistive elements 53 and 54 is connected between the cathode of the diode 51 and the emitter of the switch SL, and the off-holding path defining a path for short-circuiting the voltage dividing circuit by the off-holding switch 38 is provided. This makes it possible to surely maintain the off-state of the switch SL when the switch SL is turned off.

Furthermore, since the diodes 34 and 51 are disposed so as to be involved in all the discharge side loop paths D1 to D3, the LC resonance phenomenon can be reliably prevented.

The diodes 33A and 33B are disposed in the branch path Lch when the charging path has the power supply path Lt connected to the constant voltage power supply 31 and the branch path Lch branched from the power supply path Lt and connected to the respective gates of the switches SL1 and SL2. As a result, the LC resonance at the time of turning on the switch SL can also be prevented. Since the diodes 33 are arranged so as to be involved in all the charge side loop paths C1 to C3, the LC resonance phenomenon can be reliably prevented.

In addition, since the upper arm portion 20H and the lower arm portion 20L are connected in series by the two switches SL1 and SL2 connected in parallel, the upper arm portion 20H and the lower arm portion 20L can be applied to the inverter circuit 20.

Second Embodiment

Figure 10:
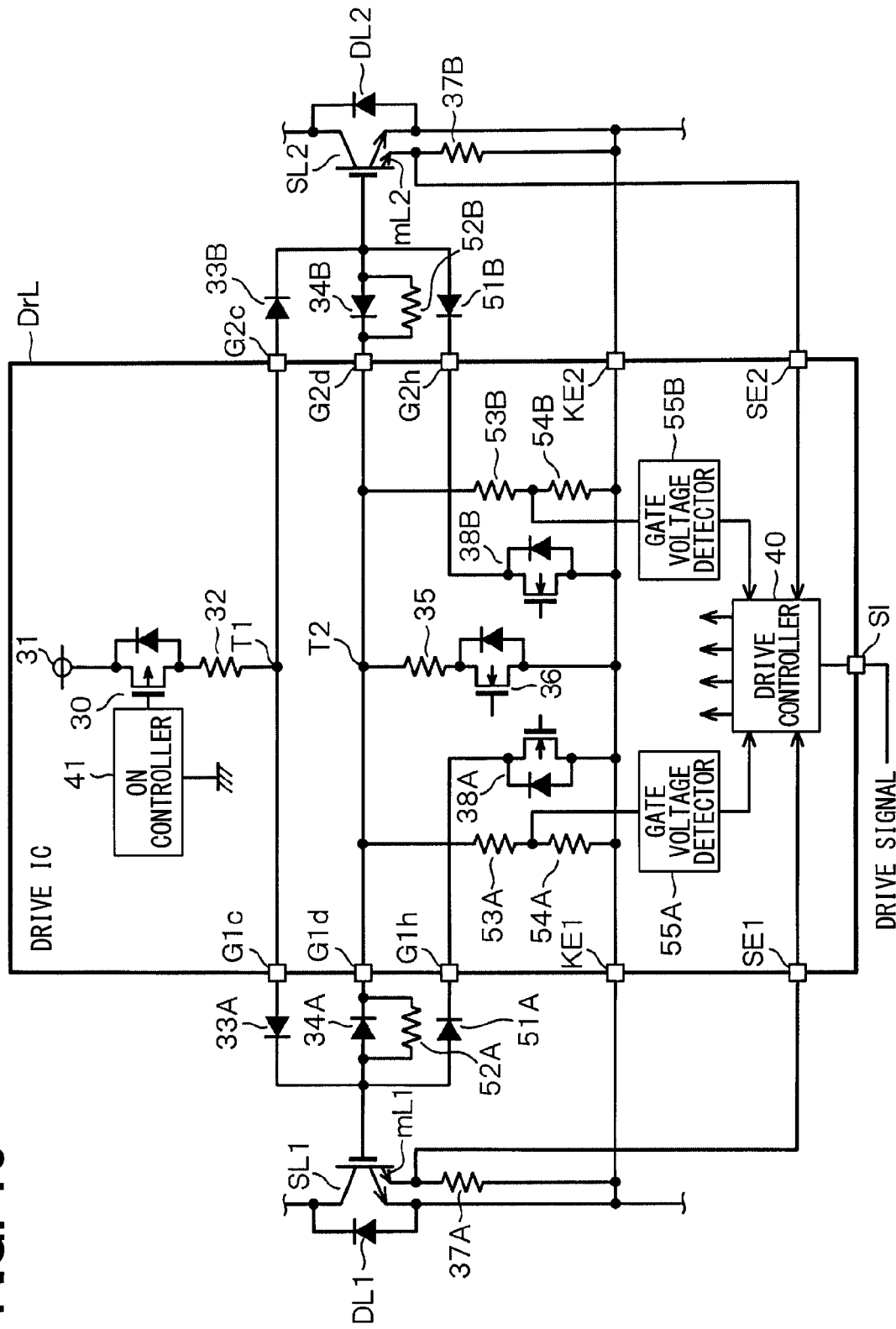
FIG. 10 is a diagram showing a drive circuit according to a second embodiment.

Hereinafter, the same components as those of the first embodiment are denoted by the same reference numerals, and descriptions of the same components will be omitted, and different portions will be described. As shown in FIG. 10, in a second embodiment, one end of the resistive element 53 is connected to the gate terminal Gd instead of the gate terminal Gh. Accordingly, the resistive element 52 is connected in parallel to the diode 34 instead of the diode 51. According to the second embodiment configured as described above, the same effects as those of the second embodiment can be obtained.

Third Embodiment

Figure 11:
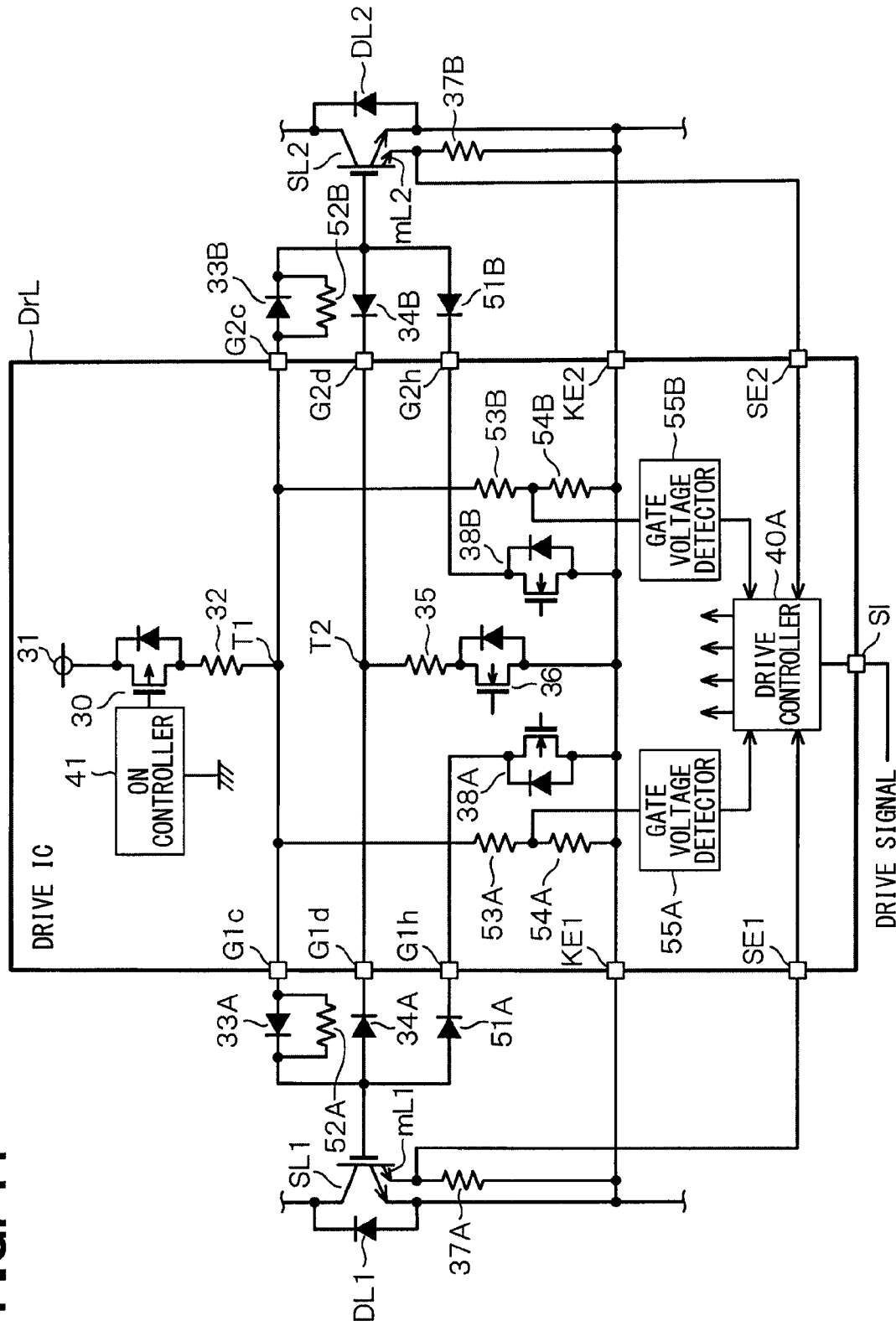
FIG. 11 is a diagram showing a drive circuit according to a third embodiment.

As shown in FIG. 11, in a third embodiment, one end of the resistive element 53 is connected to the gate terminal Gc instead of the gate terminal Gh. Accordingly, the resistive element 52 is connected in parallel to the diode 33 instead of the diode 51. In that case, the gate voltage detector 55 detects a gate voltage at the time of turning on a switch SL, and a drive controller 40A performs a control necessary at the time of turning on. The diode 51 corresponds to a charge side conduction element.

According to the third embodiment configured as described above, since the resistive element 52 is connected in parallel to the diode 33 instead of the diode 51, the gate voltage detector 55 can accurately detect the gate voltage even in a region where the gate voltage of a switch SL is in the vicinity of 0 V when the switch SL is turned on.

Fourth Embodiment

Figure 12:
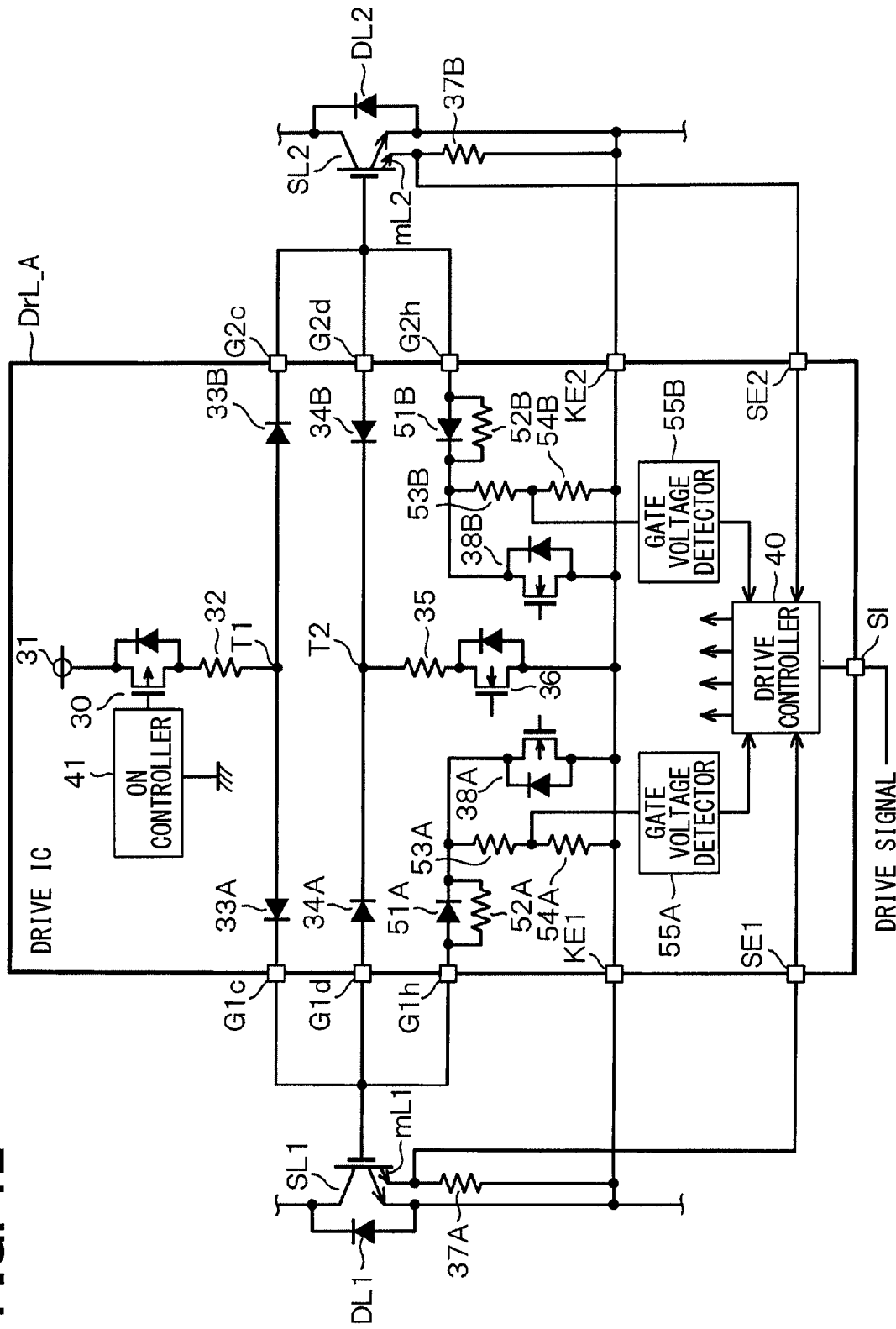
FIG. 12 is a diagram showing a drive circuit according to a fourth embodiment.

As shown in FIG. 12, in a fourth embodiment, a drive circuit DrL_A is configured by placing the diodes 33, 34 and 51 and the resistive element 52, which are externally attached to the drive circuit DrL in the first embodiment, inside a drive IC. Also in that case, the same effects as those of the first embodiment can be obtained.

Fifth Embodiment

Figure 13:
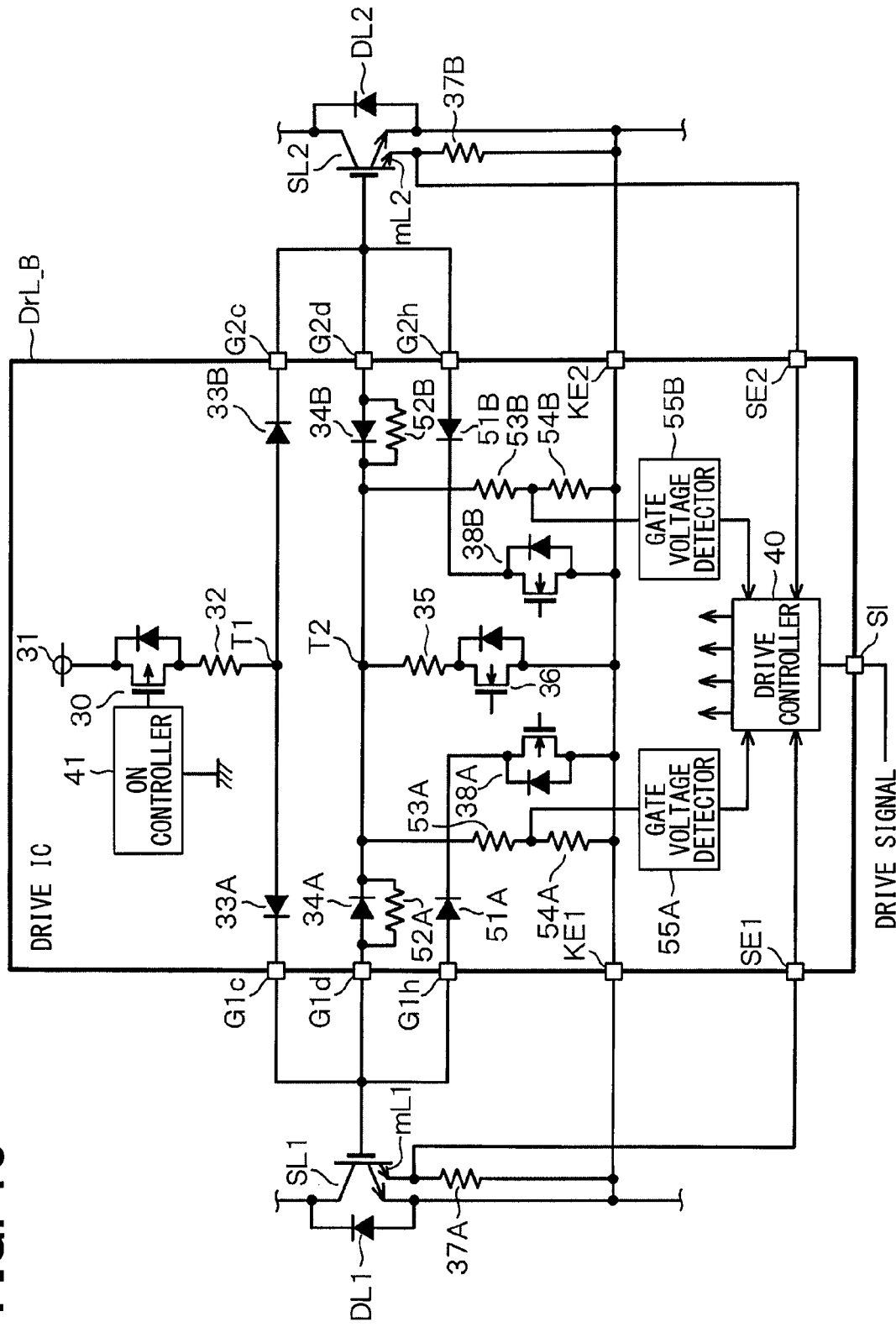
FIG. 13 is a diagram showing a drive circuit according to a fifth embodiment.

As shown in FIG. 13, in a fifth embodiment, a drive circuit DrL_B is configured by placing the diodes 33, 34 and 51 and the resistive element 52, which are externally attached to the drive circuit DrL in the second embodiment, inside a drive IC. Also in that case, the same effects as those of the second embodiment can be obtained.

Sixth Embodiment

Figure 14:
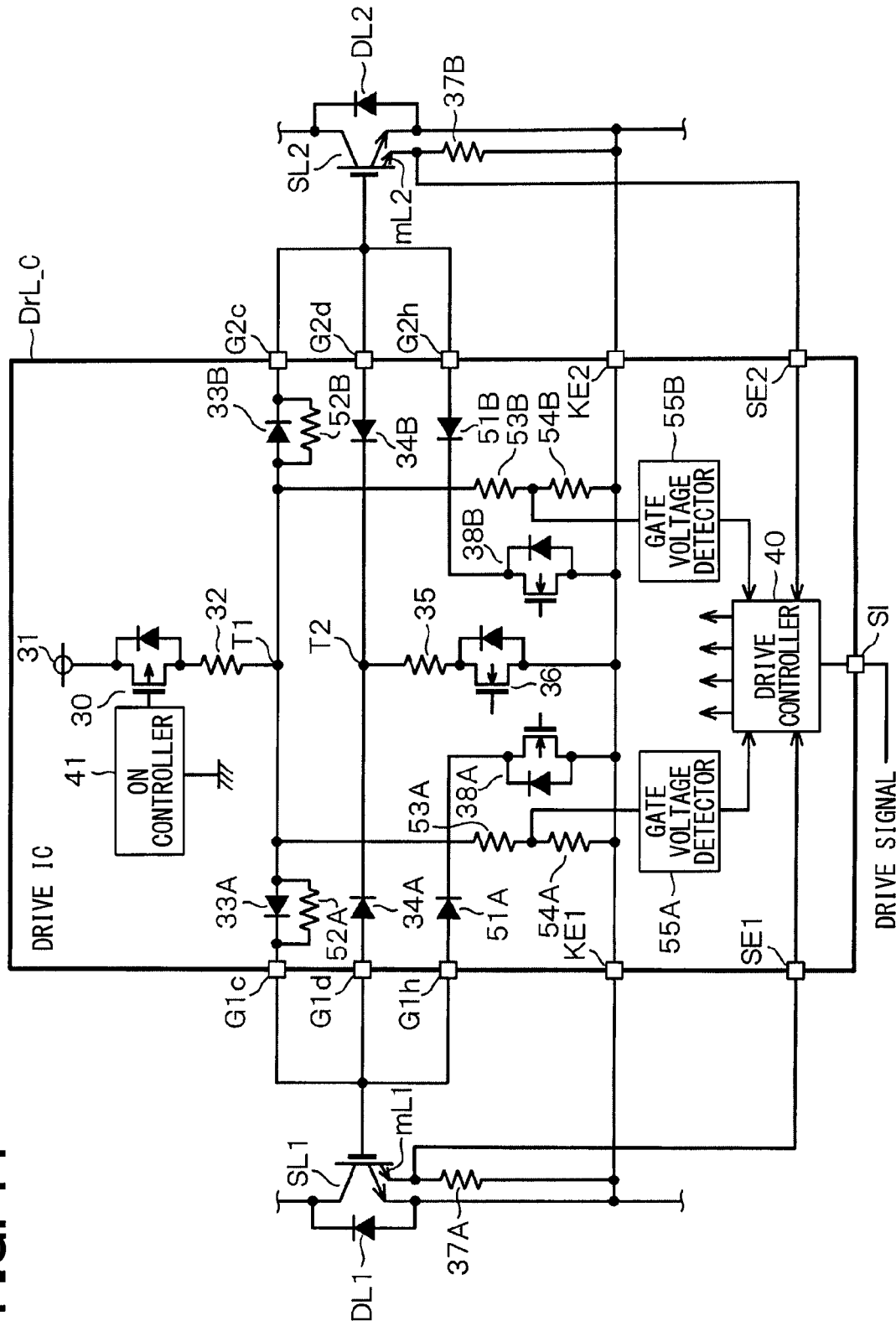
FIG. 14 is a diagram showing a drive circuit according to a sixth embodiment.

As shown in FIG. 14, in a sixth embodiment, a drive circuit DrL_C is configured by placing the diodes 33, 34 and 51 and the resistive element 52, which are externally attached to the drive circuit DrL in the third embodiment, inside a drive IC. Also in that case, the same effects as those of the third embodiment can be obtained.

Seventh Embodiment

Figure 15:
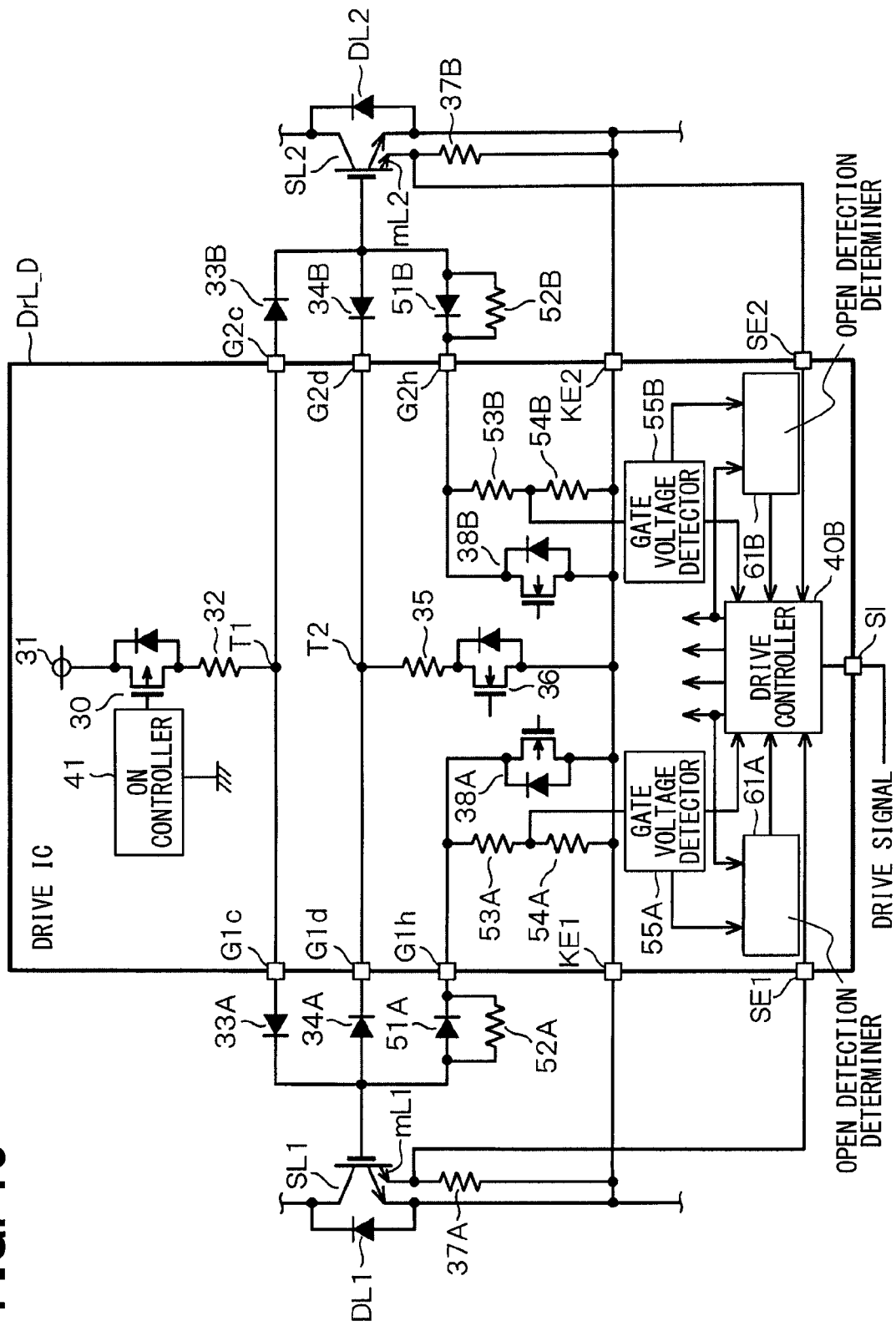
FIG. 15 is a diagram showing a drive circuit according to a seventh embodiment.

As shown in FIG. 15, in a seventh embodiment, for example, a drive circuit DrL_D is configured by adding an open detection determiner 61 to the configuration of the first embodiment. An input terminal of the open detection determiner 61 is connected to an output terminal of the gate voltage detector 55, and an output terminal of the open detection determiner 61 is connected to an input terminal of a drive controller 40B. A gate drive signal output by the drive controller 40B to switches SL is also input to the open detection determiner 61. The open detection determiner 61 corresponds to an open determiner. The gate drive signal corresponds to a control signal.

Figure 16:
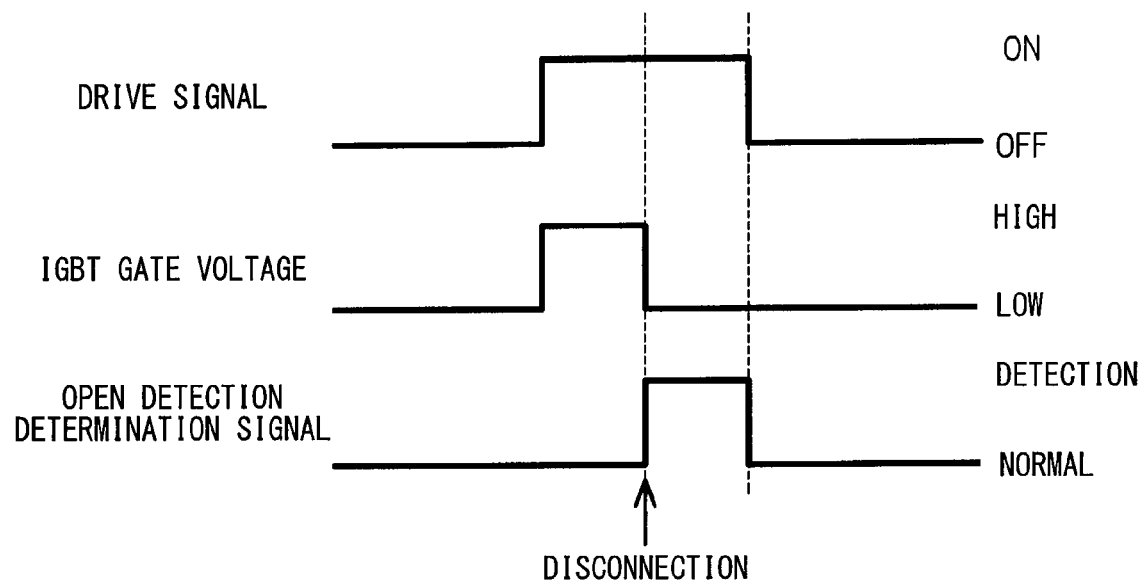
FIG. 16 is an operation timing diagram.

Next, the operation of the seventh embodiment will be described. As shown in FIG. 16, when the gate voltage is not detected by the gate voltage detector 55 during a period in which the drive controller 40B sets the gate drive signal to the high level to turn on the switch SL, the open detection determiner 61 sets the open detection determination signal provided to the drive controller 40B to the high level of an active level. When the open detection determination signal becomes active, the drive controller 40B determines that a disconnection has occurred between the drive circuit DrL_D and the gate of the switch SL. Then, the drive controller 40B stops the drive of the switch SL and performs, for example, a notification process to the user.

As described above, according to the seventh embodiment, the open detection determiner 61 can detect that the gate of the switch SL is in the open state based on the gate drive signal output by the drive controller 40B to the switch SL and the gate voltage detected by the gate voltage detector 55.

Other Embodiments

In the first embodiment, one of the first charge side diode 33A and the second charge side diode 33B may be removed. Even in that case, the LC resonance in the first to third charge side loop paths can be reduced.

In the first embodiment, one of the pair of the first and second charge side diodes 33A and 33B and the pair of the first and second discharge side diodes 34A and 34B may be removed. When the pair of the first and second charge side diodes 33A and 33B is removed, the LC resonance that occurs in the first charge side loop path C1 is not reduced.

The charge side conduction element and the discharge side conduction element are not limited to the diodes 33 and 34. In short, the charge side conduction element and the discharge side conduction element may be any element that can control the charging current and the discharging current to flow when the elements are brought into a conductive state.

In the first embodiment, an installation position of the first discharge side diode 34A in the discharging path from the first gate terminal G1 to the first emitter terminal KE1 through the first off-holding switch 38A may be changed. For example, the first discharge side diodes 34A may be provided between the first emitter terminal KE1 and the first off-holding switches 38A in the discharging path. More specifically, in the short-circuit path ES, the first discharge side diode 34A may be provided between the first off-holding switch 38A and the connection point with the second end of the first sense resistive element 37A. In that case, the influence of the voltage drop amount of the first discharge side diode 34A on the detection accuracy of the first sense voltage can be eliminated. Incidentally, in the short-circuit path, the first discharge side diode 34A may be provided between the first emitter terminal KE1 and the connection point with the second end of the first sense resistive element 37A.

The configuration described above of the first discharge side diode 34A can be similarly applied to the second discharge side diode 34B. The off-holding switch 38 may be provided as necessary.

The voltage-controlled switches configuring the inverters are not limited to the IGBT, and may be, for example, an N-channel MOSFET. A capacitor Cgs is formed between a gate and a source of the MOSFET. Further, the free wheel diodes connected to the switches in anti-parallel may be body diodes of the MOSFET or external diodes connected in anti-parallel to the MOSFET.

The number of parallel connections of the switches configuring each arm portion is not limited to two, and may be three or more. In that case, the LC resonance occurs due to a difference in the circulation completion timing of the recovery current flowing through the free wheel diodes connected in anti-parallel to at least two of those switches.

The inverter is not limited to the three-phase inverter, and may be a two-phase inverter or a four-phase inverter or more. In short, the upper and lower arm portions for at least two phases may be provided, and the O terminal, which is the connection point of the upper and lower arm portions of each phase, may be connected by an inductive load. The drive circuit is not limited to one mounted on a vehicle.

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

What is claimed is:

1. A driving device configured to drive a plurality of semiconductor switches connected in parallel to each other, each of the semiconductor switches being a voltage-controlled semiconductor switch, each of the semiconductor switches having a free wheel diode connected in anti-parallel to each of the semiconductor switches, the driving device comprising:

a charging terminal and a discharging terminal that are connected to a conduction control terminal of one of the semiconductor switches;

a charging path that includes a charge switch and the charging terminal, the charge switch enabling a charging current to flow to the conduction control terminal of the one of the semiconductor switches when the one of the semiconductor switches is switched to an on-state;

a discharging path that includes a discharge switch and the discharging terminal, the discharge switch enabling a discharging current to flow between the conduction control terminal and a low-potential side conduction terminal of the one of the semiconductor switches when the one of the semiconductor switches is switched to an off-state;

a charge side conduction element that is disposed in a charge side loop path including the conduction control terminal and the low-potential side conduction terminal of the one of the semiconductor switches and constituting a part of the charging path, and enables the charging current to flow in a conductive state;

a discharge side conduction element that is disposed in a discharge side loop path including the conduction control terminal and the low-potential side conduction terminal of the one of the semiconductor switches and constituting a part of the discharging path, and enables the discharging current to flow in a conductive state;

a voltage detection unit that is connected to a current output terminal of at least one of the charge side conduction element and the discharge side conduction element; and a resistive element that is connected in parallel to at least one of the charge side conduction element and the discharge side conduction element, wherein at least the charge switch, the discharge switch, and the voltage detection unit are configured as a drive integrated circuit (drive IC).

2. The driving device according to claim 1, wherein the discharge side conduction element is a diode.

3. The driving device according to claim 1, further comprising
an off-holding path, wherein
the voltage detection unit includes a voltage dividing circuit that is connected between the current output terminal of the discharge side conduction element and the low-potential side conduction terminal of the one of the semiconductor switches, and
the off-holding path constitutes a path for short-circuiting the voltage dividing circuit.

4. The driving device according to claim 3, wherein the discharge side conduction element is an off-side conduction element disposed in the off-holding path and having a rectifying function in a direction in which the discharging current flows.

5. The driving device according to claim 4, further comprising
an off-holding switch that is provided in the off-holding path and is turned on when the voltage dividing circuit is short-circuited.

6. The driving device according to claim 1, wherein the discharge side loop path is one of a plurality of discharge side loop paths, the discharge side conduction element is one of a plurality of discharge side conduction elements, and all the discharge side loop paths respectively include the discharge side conduction elements.

7. The driving device according to claim 1, wherein
the charging path includes a power supply path connected to a power supply, and a branch path branched from the power supply path and connected to the conduction control terminal of the one of the semiconductor switches, and
the charge side conduction element is disposed in the branch path.

8. The driving device according to claim 7, wherein the charge side conduction element is a diode.

9. The driving device according to claim 1, wherein the charge side loop path is one of a plurality of charge side loop paths, the charge side conduction element is one of a plurality of charge side conduction elements, and all the charge side loop paths respectively include the charge side conduction elements.

10. The driving device according to claim 1, wherein the semiconductor switches connected in parallel to each other configure each of an upper arm portion and a lower arm portion connected in series with each other.

11. The driving device according to claim 1, further comprising
an open determiner that is configured to receive a control signal input to the conduction control terminal and a voltage detected by the voltage detection unit, and determines whether the conduction control terminal is in an open state based on the control signal and the voltage.

12. The driving device according to claim 1, wherein the drive IC further includes the charge side conduction element, the discharge side conduction element, and the resistive element.

\* \* \* \* \*